US006704277B1

(12) United States Patent  
Dabral et al.

(10) Patent No.: US 6,704,277 B1
(45) Date of Patent: Mar. 9, 2004

(54) TESTING FOR DIGITAL SIGNALING

(75) Inventors: Sanjay Dabral, Palo Alto, CA (US); Ming Zeng, San Jose, CA (US); Chung-Wai Yue, Hopewell Junction, NY (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/474,564

(22) Filed: Dec. 29, 1999

(51) Int. Cl.$^7$ ................................................. H04J 1/00
(52) U.S. Cl. ....................... 370/201; 370/282; 370/284; 375/346; 375/416; 379/416
(58) Field of Search .............................. 370/201, 276, 370/282, 283, 284, 285, 293, 401, 402, 522; 375/220, 257, 288, 346, 349; 379/416, 417; 324/628; 333/12, 238

(56) References Cited

U.S. PATENT DOCUMENTS

| | | | |
|---|---|---|---|
| 3,992,686 A | * | 11/1976 | Canning ................. 333/238 |
| 4,859,877 A | | 8/1989 | Cooperman et al. |
| 5,216,667 A | | 6/1993 | Chu et al. |
| 5,235,296 A | | 8/1993 | Saka |
| 5,349,743 A | | 9/1994 | Grader et al. |
| 5,359,304 A | | 10/1994 | Fujiki |
| 5,369,379 A | | 11/1994 | Fujiki |
| 5,402,440 A | | 3/1995 | Marbot |
| 5,502,391 A | * | 3/1996 | Sciacero et al. ............ 324/628 |
| 5,502,716 A | | 3/1996 | Rhebergen |
| 5,521,563 A | | 5/1996 | Mazzochette |
| 5,579,336 A | | 11/1996 | Fitzgerald et al. |
| 5,625,328 A | | 4/1997 | Coleman, Jr. |
| 5,638,402 A | * | 6/1997 | Osaka et al. ................. 375/257 |
| 5,689,217 A | | 11/1997 | Gu et al. |
| 5,742,210 A | | 4/1998 | Chaturvedi et al. |
| 5,825,260 A | | 10/1998 | Ludwig et al. |
| 5,841,328 A | | 11/1998 | Hayashi |
| 5,936,946 A | | 8/1999 | Hoffmann |
| 6,285,653 B1 | * | 9/2001 | Koeman et al. ............ 370/201 |

FOREIGN PATENT DOCUMENTS

FR          0077725          4/1983

OTHER PUBLICATIONS

Std 1194–1991, IEEE Standard for Backplane Electrical Performance, pp. 1–43.*
Haas et al, Long Distance Differential Transmission of DS Links over Copper Cable, CERN–European Organization For Nuclear Research, pp. 1–33, Jul. 1, 1993.*
Simpkins A., "Measurement and Performance of the Modern Backplane", Electronic Engineering, Morgan–Grampian Ltd. London, GB, vol. 67, No. 823 (Jul. 1, 1995) at 51–52, 54, 56.
Schrift R., "Digital Bus Faults Measuring Techniques", Proceedings of the International Test Conference, 1998, ITC '98 Washington, D. C. at 382–387.

* cited by examiner

*Primary Examiner*—Seema S. Rao
*Assistant Examiner*—Frank Duong
(74) *Attorney, Agent, or Firm*—Blakely, Sokoloff, Taylor & Zafman LLP

(57) ABSTRACT

In an electronic system having logic agents that communicate with each other through one or more signal lines, a method for testing high speed digital signaling on the signal lines is disclosed. The method involves sensing a first crosstalk signal induced by a first digital signal. The first digital signal is driven by a first logic agent into a signal line to communicate with a second agent. The second agent is coupled to receive the first digital signal from the signal line. A logic waveform that represents the digital signal is recorded and/or displayed, based upon the crosstalk signal. The technique may also be used for testing simultaneous bidirectional signaling on the same signal line.

39 Claims, 9 Drawing Sheets

TESTING FOR DIGITAL SIGNALING

FIELD OF THE INVENTION

This invention is generally related to the testing of manufactured, high speed digital electronic systems having unidirectional or bidirectional signaling.

BACKGROUND

The testing of manufactured digital electronic systems having high speed links plays an important role in delivering reliable products that operate using the state-of-the-art in high speed digital technology. Examples of typical systems that benefit from such testing and verification include, for instance, high end personal computers, server machines, and more specialized data communication components such as network routers and switches. The high speed links in such systems include for instance interchip communications involving unidirectional signal flow on one or more conductors in either a point-to-point interconnect or over a shared bus. Unidirectional signal flow means that at any given moment, there is a single signal propagating only in one direction on a particular conductive line that is connected between two chips. To increase the effective bandwidth per line, a bidirectional signaling scheme has been proposed where digital data is transmitted simultaneously in two directions over one conductive line. This is done by having two signals propagate simultaneously in opposite directions on the same line. The high speed digital signal being driven into the conductive line in both unidirectional and bidirectional schemes is composed of a sequence of pulses representing binary values (logical "1" or "0").

As the rate of transmission of data and the amount of parallel data transmitted in the above described systems increases, the cost of designing and manufacturing fully functional systems increases dramatically. This is in part due to the difficulty in testing such high speed systems. The signals in such systems are driven at relatively low power levels in order to reduce the total power consumption of the system in which hundreds of such high speed signals may be propagating simultaneously in parallel. Typically, a probe may be applied to the interconnect lines, while the system is operating at its maximum intended speed, to pick up the digital signals and transfer them to high speed detection circuitry inside a logic analyzer or other test equipment for processing and display. However, unless the probe has extremely low capacitance, electrically loading the lines in this way may cause a distortion of the high speed digital signals that are propagating therein because of the low power levels and high frequencies at which the signals are being driven. As such, the line is not being tested while functioning as intended. For simultaneous bidirectional signaling, direct probing may not help identify the driven states, unless some mechanism is provided that can isolate the opposite traveling signals. Another technique requires that the system be "slowed" so that the main signals that propagate on the interconnect lines have sufficient time to settle given the greater loads presented by the probes. Once again, such a solution does not allow the high speed system to be evaluated at its maximum intended speed of operation. Another limited solution is to design built-in high speed detection and test circuitry into each receiving or transmitting chip of the system, and provide the output of such built-in circuitry to the logic analyzer. Such a solution, however, requires significantly greater on-chip area as well as additional pins to be added to the integrated circuit (IC) package containing the chip.

SUMMARY

According to an embodiment of the invention, a method is disclosed that involves sensing a first crosstalk signal induced by a first digital signal. The first digital signal is being driven by a first logic agent into a signal line to communicate with a second logic agent. The second agent is coupled to receive the first digital signal from the signal line. The method further includes at least one of displaying and recording a logic waveform that represents the digital signal, based upon the crosstalk signal.

BRIEF DESCRIPTION OF THE DRAWINGS

The invention is illustrated by way of example and not by way of limitation in the figures of the accompanying drawings in which like references indicate similar elements and in which.

DETAILED DESCRIPTION

According to the invention, a crosstalk scheme is used to detect transmissions between logic agents coupled to a signal line. The crosstalk technique described herein allows the testing of high speed digital signaling at the maximum intended speed of the system, without substantially distorting the main signaling and without adding additional circuitry to the system and without adding additional pins to the IC packages of the system chips. In addition, in a particular embodiment of the invention, the crosstalk scheme allows for testing while the high speed signal line is simultaneously bidirectionally active and is operating at the maximum intended speed.

Figure 1A:
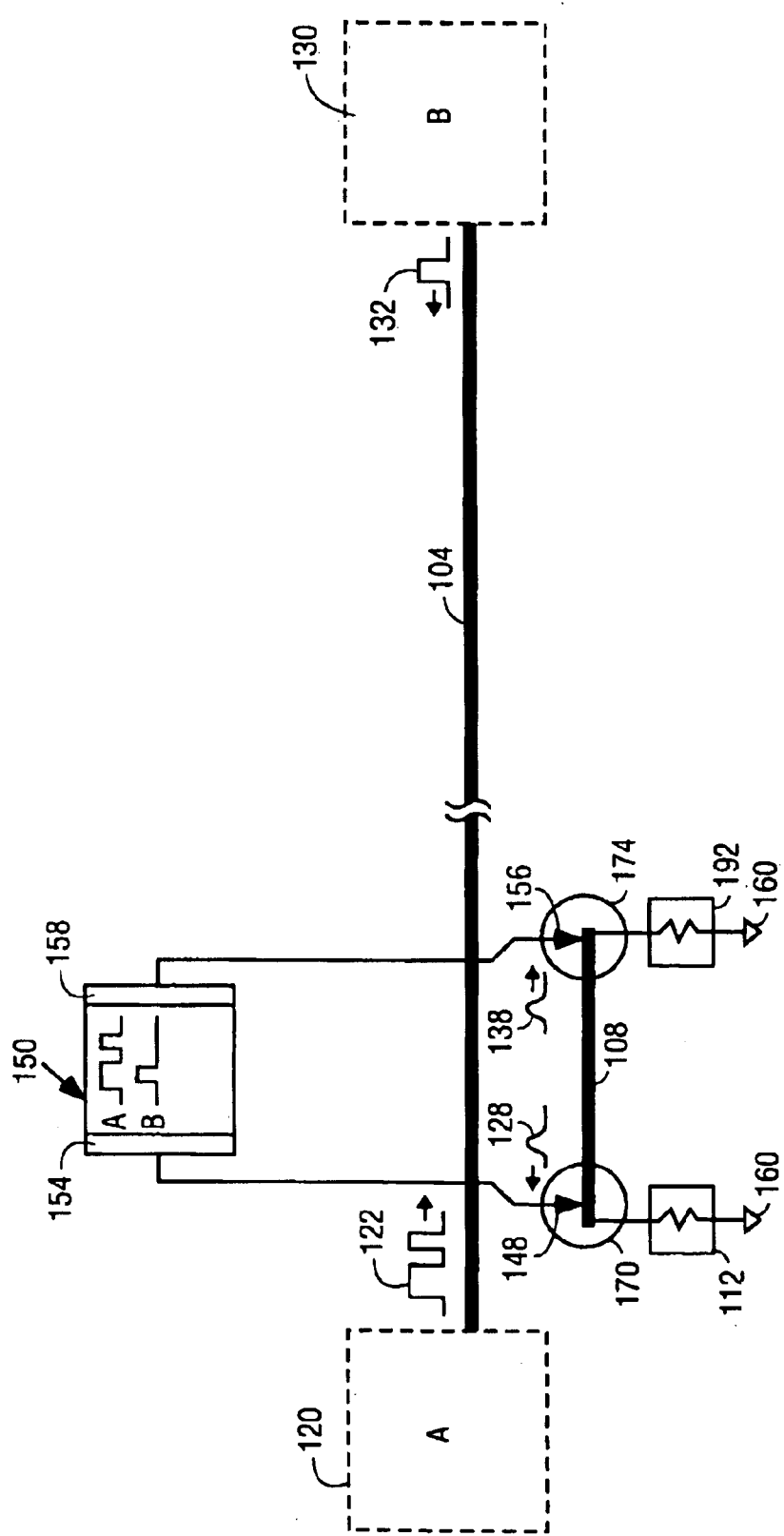
FIGS. 1A and 1B show block diagrams of electronic systems according to different embodiments of the invention.

FIG. 1A illustrates an electronic system configured according to an embodiment of the invention. A signal line 104 is shown to which are coupled logic agent 120("A") and logic agent 130("B"). The signal line 104 may be a single wire or other conductor such as a chip to chip interconnect on a printed circuit board that two or more logic agents use to communicate with each other using digital signals. Each logic agent may be one or more chips that implement a wide range of logic functions such as processors, memory, and bus to bus bridges, where at least one of these chips includes the circuitry needed to receive and transmit high speed digital signals over the chip to chip interconnect. The logic agent 120 is capable of driving a first digital signal 122 into the signal line 104 to communicate with the second agent 130. The digital signal that is actually driven may have dual voltage or current levels that represent separate logic states ("0" and "1"), and may take the form of a sequence of pulses switching at upwards of several hundred megahertz although the invention is not limited to such a range of frequencies. The second logic agent 130 receives this digital signal and recovers the logic information directly from the signal line 104. In a particular embodiment of the invention, the logic agents are coupled to the signal line 104 via respective, dc paths. This is in contrast to the ac coupling between the signal line 104 and a first sample line 108 as seen in FIG. 1A.

The first sample line 108 is generally electrically isolated from and disposed with respect to the signal line 104 so that a first crosstalk signal 128, induced in response to the first digital signal 122, can be sensed on the sample line 108. In addition, the sample line is sized and positioned such that the electromagnetic coupling between it and the signal line will not cause undue distortion in the first digital. A probe 148 makes a dc contact with the sample line 108 to pick up the crosstalk signal 128. Test equipment 150 is coupled to the probe 148 to sense the first crosstalk signal 128, and displays a first logic waveform (labeled "A" in FIG. 1A) representing the first digital signal that is driven into the signal line 104, based upon the first crosstalk signal 128. In particular, the test equipment 150 may be equipped with a first interface 154 which includes additional signal processing and conditioning circuitry needed to convert transitions in the first crosstalk signal 128 into a logic waveform. The logic waveforms may be displayed according to a wide range of techniques, such as on a monitor or printed on paper or they may be recorded digitally for use with computer aided analysis. The characteristics of the crosstalk signal 128 can be directly correlated to those of the driven digital signal 122, as will be illustrated below.

In a particular embodiment of the invention, the sample line 108 has a near portion 170 and a far portion 174. The signal line 104 has a first point at which the logic agent 120 drives the first digital signal 122 into the signal line 104. The near portion 170 is defined as being closer than the far portion 174, as measured along the signal line 104, to the first point. As shown in FIG. 1A, the probe 148 from the test equipment 150 contacts the near portion 170 of the sample line 108 to pick up the first crosstalk signal 128. This crosstalk signal picked up at the near portion 170 is also known as a "backward" crosstalk signal for reasons that will become apparent below in connection with FIG. 5.

For the embodiment of the invention that encompasses bidirectional signaling between logic agents, the same sample line 108 may be used to also detect transmissions from the second logic agent 130. The logic agent 130 drives a second digital signal 132 into the signal line 104 to communicate with the agent 120. The sample line 108 is disposed with respect to the signal line 104 so that a second "backward" crosstalk signal 138 is induced in the sample line 108 in response the second digital signal 132. The test equipment 150 is coupled, via a second probe 156 and a second interface 158, to sense the second crosstalk signal 138 from the sample line 108. A second logic waveform (labeled "B" in FIG. 1A) representing the second digital signal 132 is displayed based upon the second crosstalk signal 138. In this way, the test equipment 150 can isolate communications between the logic agents with minimum disturbance of the digital signals they use to communicate with each other on the signal line 104. If desired, the electronic system may be tested while the logic agents are communicating simultaneously with each other, respectively and simultaneously driving their digital signals in opposite directions on the signal line 104. This situation is depicted in FIG. 1A where the test equipment 150 shows logic waveforms A and B being active simultaneously.

In the particular embodiment of the invention that involves such bidirectional signaling between agents as shown in FIG. 1A, the signal line 104 has a second point at which the logic agent 130 drives the second digital signal 132 into the signal line 104. In this embodiment, the far portion 174 of the sample line 108 is closer than the near portion 170, as measured along the signal line 104, to this second point. Here, it is the far portion 174, which is contacted by the second probe 156, that transfers to the test equipment 150 the sensed second crosstalk signal. In general, there may be a range of suitable positions on the sample line (other than at the near and far portions) at which the different backward crosstalk signals may be sensed.

Figure 1B:
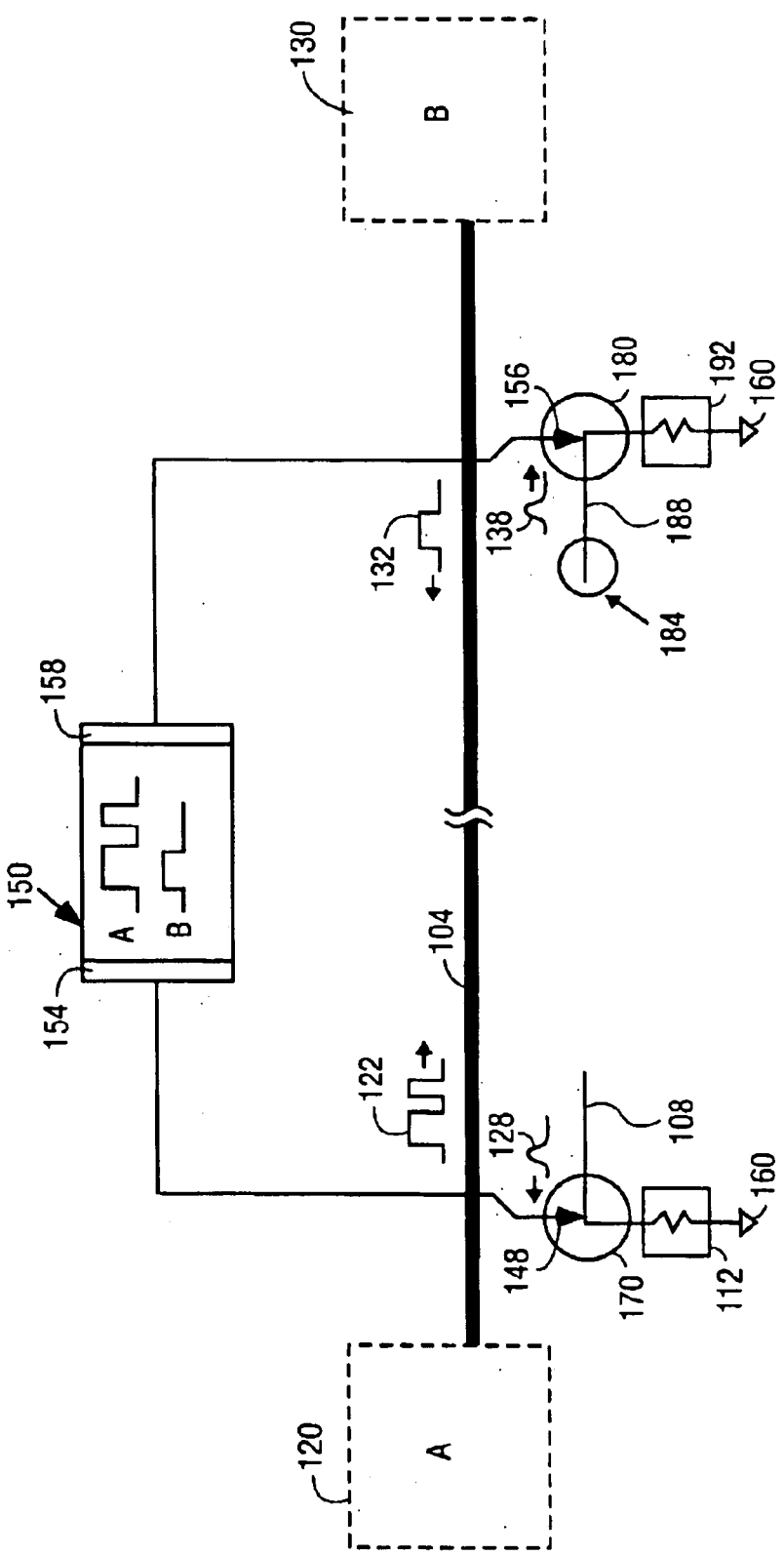

In another embodiment of the invention shown in FIG. 1B, the second crosstalk signal 138 is sensed not from the far portion 174 of the sample line 108, but rather from a near portion 180 of a second sample line 188. The second sample line 188 is a separate piece of conductive wire or printed circuit board line generallly electrically isolated from both the first sample line 108 and the signal line 104. Note that the second sample line 188 also has a near portion 180 and a far portion 184, similar to the first sample line 108, where the near portion 180 is closer to the point on the signal line 104 at which the agent 130 drives the second digital signal 132.

In both the embodiments of FIG. 1A and FIG. 1B, the portions of the sample lines at which the crosstalk signals are sensed are coupled to a power supply node 160 through line termination, devices 112 and 192, respectively. Such termination devices increase the cost of the overall system, but they tend to promote cleaner crosstalk signals by tending to suppress reflections along the sample line 108 if they are matched to the characteristic impedance of the sample line. The sample lines can be terminated at the positive (e.g., Vcc) or negative (e.g. Vss or ground) power supply nodes, or at a suitable bias point (e.g., Vcc/2) to help instrumentation.

Although the invention has been illustrated using a single signal line 104 on which the digital signals are driven in a single ended fashion with reference to the power supply node 160, the invention may also be applied to links between logic agents that are differential rather than single ended. With differential links, a second signal line substantially identical to the first signal line 104 would also couple the two logic agents, where the pair of signal lines will be used for differential signaling between the two agents.

Figure 2:
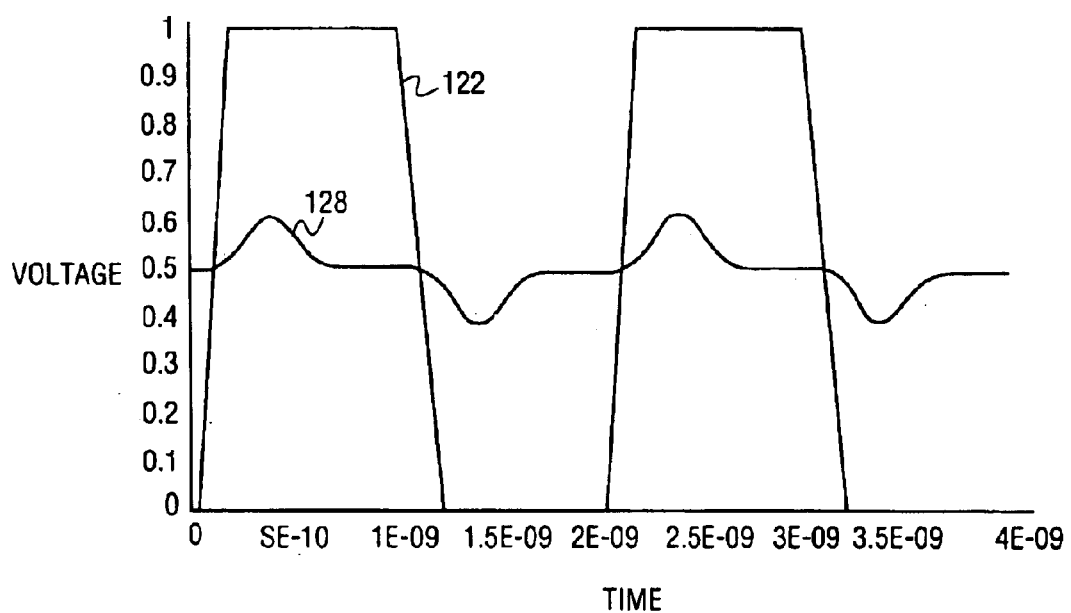
FIG. 2 shows a driven signal and its corresponding induced crosstalk signal as measured in an embodiment of the invention.

FIG. 2 illustrates waveforms obtained from computer simulations of an electronic system configured according to FIG. 1B. A time domain waveform of the first digital signal 122 is shown superimposed with the waveform of a corresponding crosstalk signal 128 sensed at the near portion 170 of the sample line 108. It can be seen that the shape of the crosstalk waveform can be correlated with the shape of the first digital waveform, such that the rising and falling edges of the digital waveform may be deduced based on an analysis of the measured crosstalk waveform.

One factor that may determine the amplitude and shape of the crosstalk waveform is the strength of the ac coupling between the sample line and the signal line. This coupling is in general a function of the geometry of the sample and signal lines, as well as the dielectric material which isolates the sample and signal lines.

Figure 3:
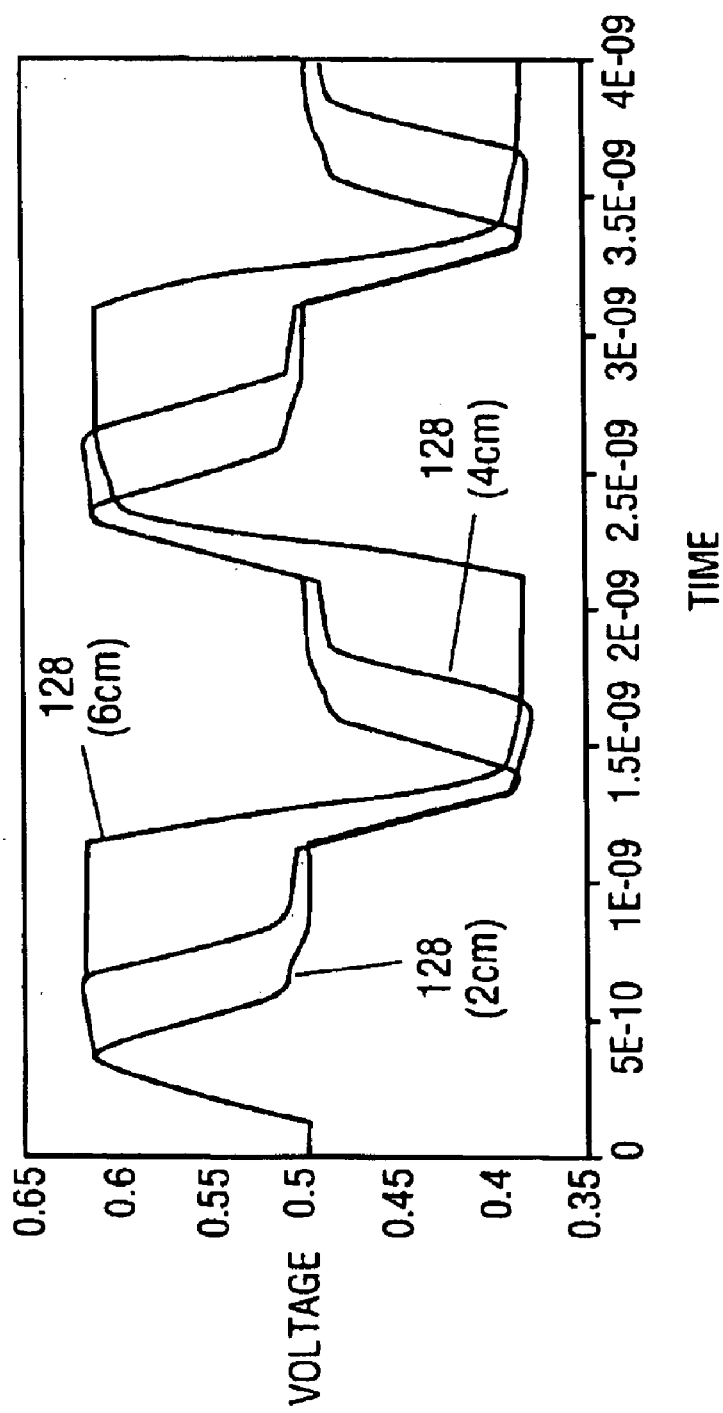
FIG. 3 illustrates crosstalk signals as a function of the length of the sample line for various embodiments of the invention.

Another factor that may contribute to the shape of the crosstalk waveform is illustrated in FIG. 3. FIG. 3 shows how the crosstalk waveform varies as a function of the length of the sample line 108, all other factors being kept the same. It can be seen that as the length of the sample line is increased, the coupling becomes stronger such that the pulse width in the crosstalk waveform increases, indicating that the energy in the crosstalk signal increases. The length should be selected such that the crosstalk signal can be easily sensed by the test equipment.

Figure 4A:
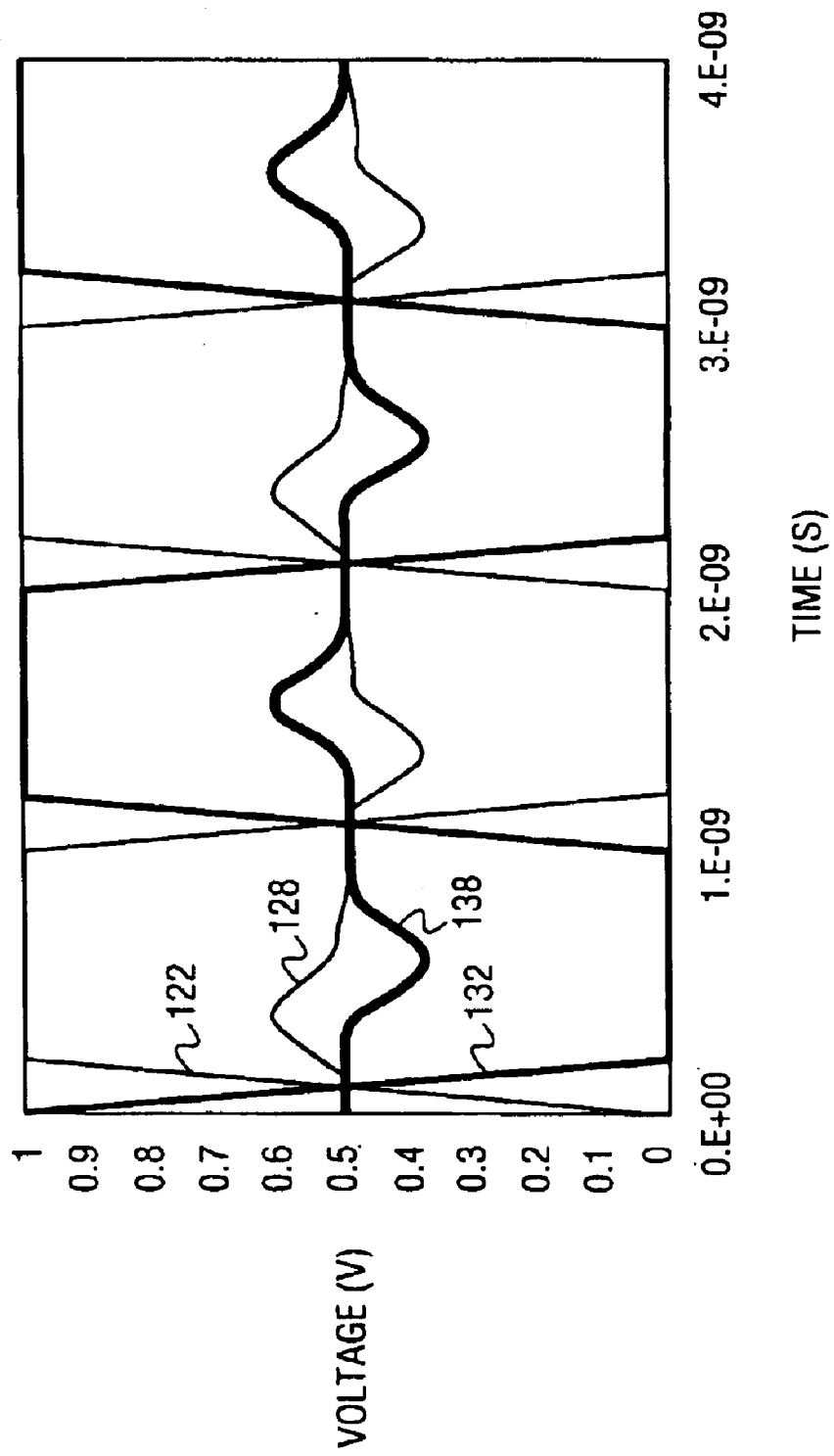
FIG. 4A illustrates simultaneous, bidirectionally driven signals and their corresponding crosstalk signals.

FIG. 4A illustrates waveforms obtained from the system of FIG. 1B configured for bidirectional signaling. The signaling is bidirectional because the waveforms corresponding to both the first digital signal 122 and the second digital signal 132 are changing values simultaneously. As can be seen in FIG. 4A, the waveforms for the first crosstalk signal 128 and the second crosstalk signal 138 are clearly distinguishable and therefore can be used to accurately represent the rising and falling edges of their respective digital signals. The phase shift between the first and second crosstalk signals may be attributed to the unequal distance between the near portions 170 and 180 and the points at opposite ends of signal line 104 at which the logic agents 120 and 130 respectively drive their digital signals.

Figure 4B:
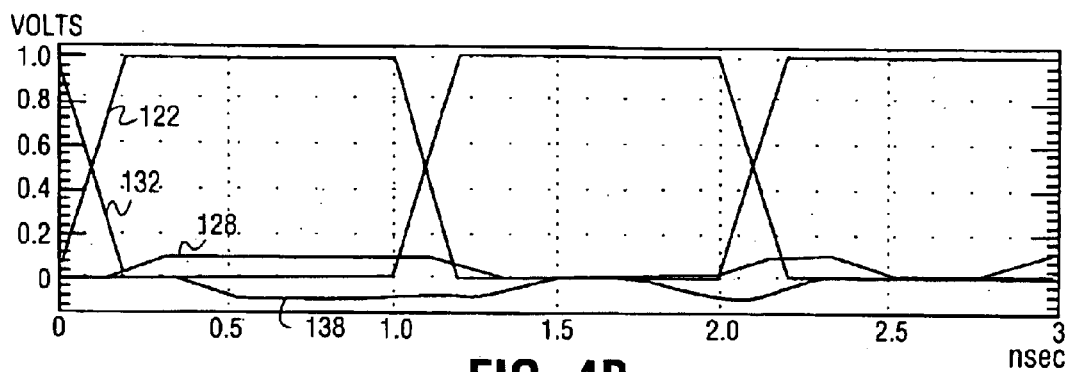
FIGS. 4B–4E shows the effect on the crosstalk signals of changing the length of the sample line.
Figure 4C:
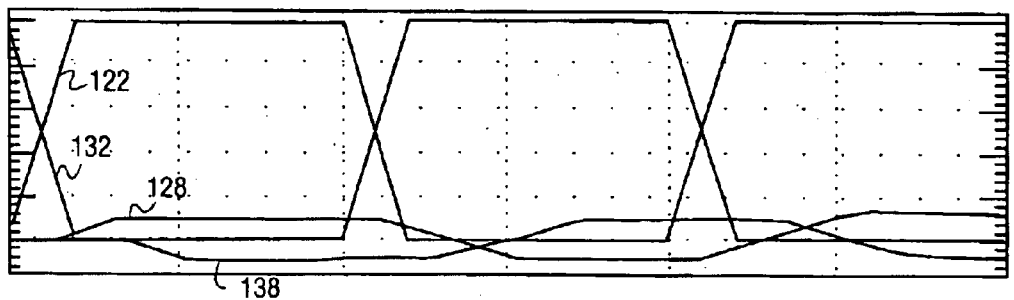
Figure 4D:
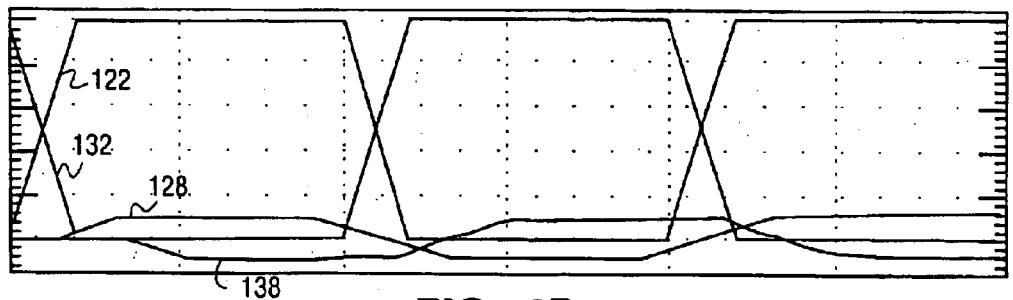
Figure 4E:
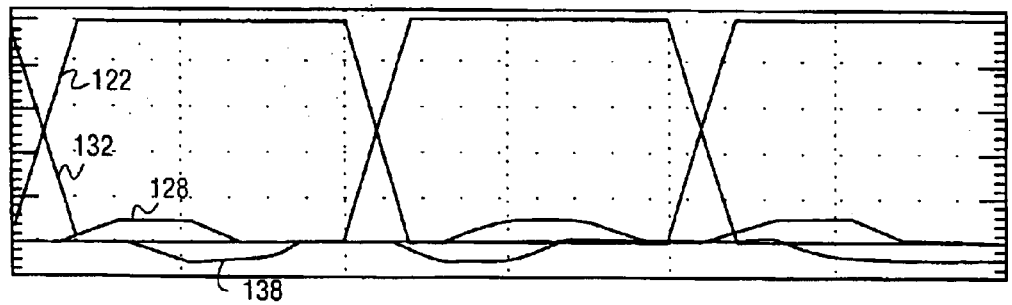

FIGS. 4B–4E show the effect on the crosstalk signals of decreasing the length of the sample line 108, all other factors remaining equal (see FIG. 1A, momentarily). For instance, it may be desirable that the "flight time" of the sample line be one half of a bit cell being transmitted in the digital signals. In that case, the pulse sensed on the sample line is approximately one bit cell long (twice the flight time). This situation is depicted in FIG. 4D. Such a configuration is particularly useful for sensing clock signals where it may not be desirable to have a quiescent state between the crosstalk pulses. Reducing the length of the sample line further yields the results in FIG. 4E in which a quiescent state appears between successive crosstalk pulses, as seen in both the first crosstalk signal 128 and the second crosstalk signal 138. FIGS. 4C and 4B illustrate the effect of increasing the length of the sample line 108.

In FIG. 4B, the length of the line is too long to derive an accurate clock signal based upon the crosstalk signals 128 and 138, because the transitions in the crosstalk signals 128 and 138 do not crossover as in FIGS. 4C and 4D, and neighboring bit cells are interfering with each other in the crosstalk signals.

Figure 5:
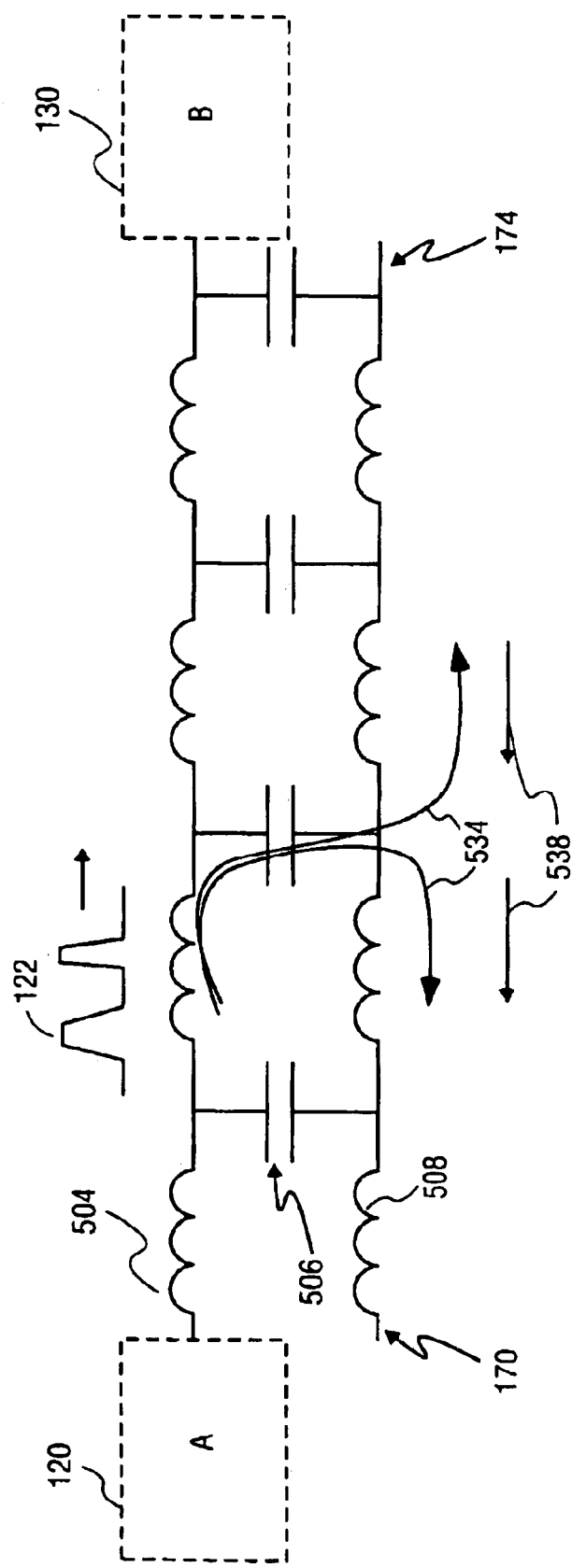
FIG. 5 shows a proposed lumped-element equivalent circuit for the signal line and sample line combination shown in FIG. 1.

FIG. 5 illustrates a lumped element equivalent circuit of the embodiment of the invention shown in FIG. 1A. This figure is proposed to explain the mechanism by which the crosstalk signals are formed in the sample line 108. The signal line 104 is in part represented by a series of inductors 504 whereas the sample line 108 is in part represented by a series of inductors 508 between the near portion 170 and the far portion 174. The ac coupling between the sample line 108 and the signal line 104 is modeled by shunt capacitors 506, such that the lumped element equivalent circuit shown in FIG. 5 resembles that of a two conductor transmission line. The first digital signal 122 driven by the logic agent 120 produces two types of current in the sample line. A pair of capacitive current components 534 are induced in the inductors 508 in opposite directions. In addition, a magnetically coupled return current 538 flows in the inductors 508 of the sample line. Thus, it can be seen that for a digital signal 122 generated by the agent 120 and directed to the right side of FIG. 5, the capacitive current component 534 that is induced towards the far portion 174 opposes the magnetically coupled return current 538, thus causing the "forward" crosstalk signal measured at the far portion 174 to be of relatively low amplitude. In contrast, the capacitive current component 534 that is directed towards the near portion 170 is in the same direction as the magnetically coupled return current 538, such that the "backward" crosstalk signal measured at the near portion 170 has a relatively high amplitude. This backward crosstalk signal is the sensed crosstalk signal that represents the digital signal 122 being driven by the first logic agent 120 into the signal line 104. To enhance the backward crosstalk signal, and also suppress the forward crosstalk signal, the cross section of the structure (e.g. printed circuit board) containing the signal line and the sample line should be uniform, i.e. have the same dielectric constant and be a stripline.

Figure 6:
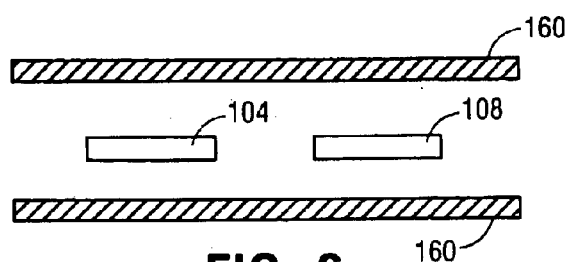
FIG. 6 shows a cross sectional view of an arrangement for the signal and sample lines.
Figure 7:
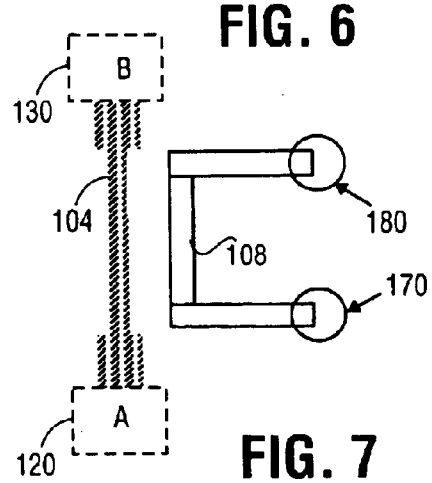
FIG. 7 shows a top view of the arrangement of FIG. 6.

Having described the various embodiments of the invention, and proposed explanations for the generation of the crosstalk signals, to test high speed digital signaling links, FIGS. 6–9 show some exemplary physical implementations of the signal and sample lines. In FIG. 6, the signal and sample lines run parallel to each other and are separated by a uniform distance. In addition, the signal line 104 and the sample line 108 are "side-by-side" and sandwiched between plates that represent the power supply node 160, wherein the signals on the signal and sample lines are measured with respect to a potential on the supply node 160. FIG. 7 shows a top view of the arrangement of FIG. 6 indicating where the logic agents 120 and 130 would connect as well as the near portion 170 and the far portion 180 of the sample line 108.

Figure 8:
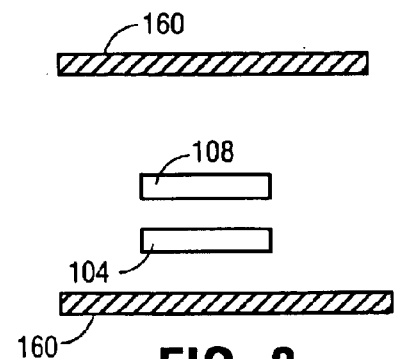
FIG. 8 shows a cross sectional view of another arrangement for the signal and sample lines.
Figure 9:
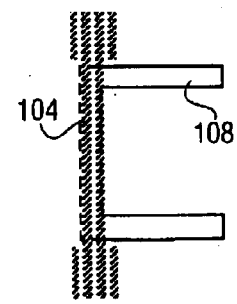
FIG. 9 illustrates a top view of the arrangement of FIG. 8.

FIG. 8 shows a cross sectional view of another implementation for the signal and sample lines. In this case, although the two lines are still suspended within a dielectric material between a pair of conductive planes that are the supply nodes 160, both the signal and sample lines share the same vertical axis. FIG. 9 shows a layout view of the implementation of FIG. 8 where the sample line 108 is shown as being above the signal line 104. It has been determined that the particular implementation of FIGS. 8 and 9 provides stronger coupling between the signal and sample lines than the implementation of FIG. 6. In general, adding the sample line 108 will reduce the effective characteristic impedance of the signal line 104. Thus, to match the standard impedance of line terminations, the signal line should be designed to have a slightly higher characteristic impedance by itself so that when the sample line is added, the signal line will present the standard impedance.

Figure 10:
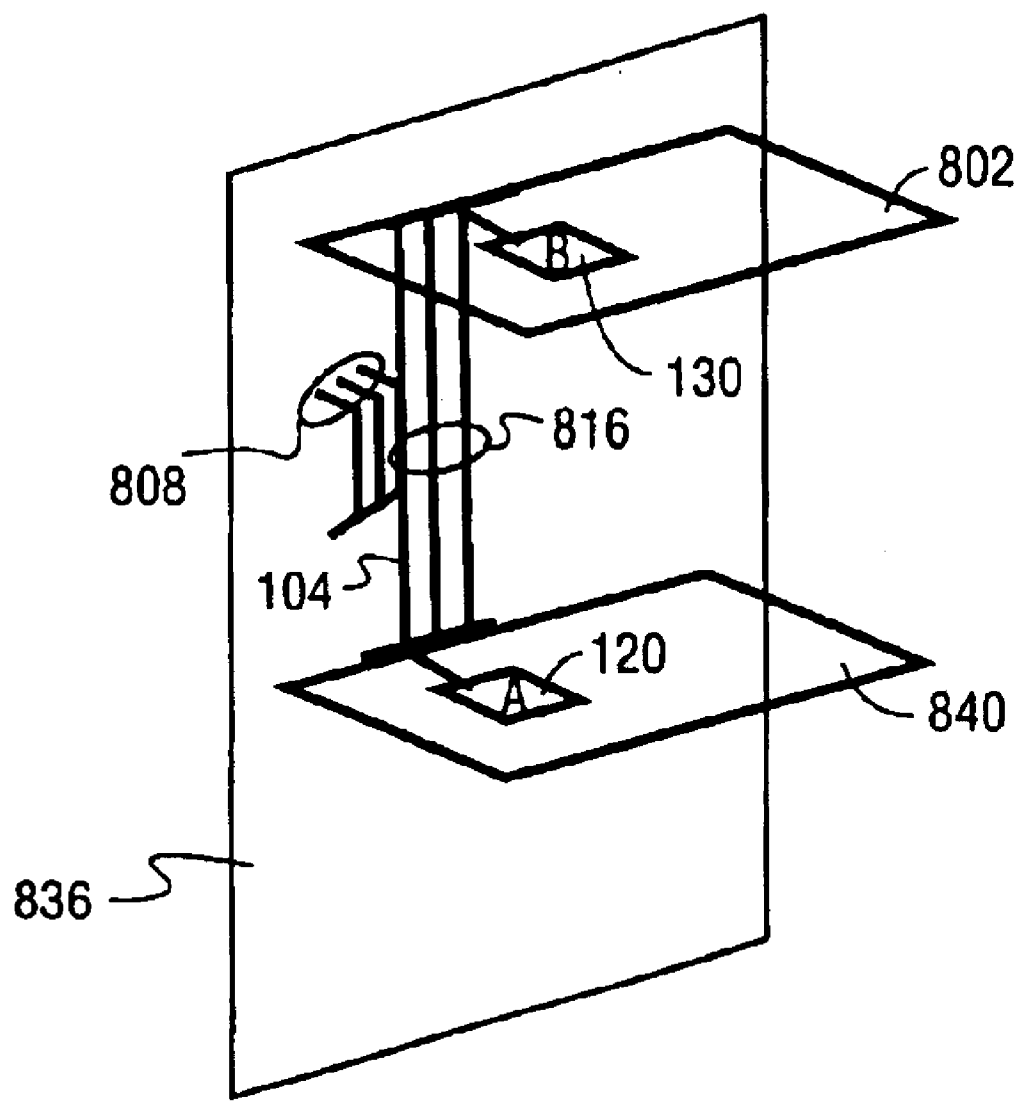
FIG. 10 shows an electronic system having a back plane and multiple cards connected to the back plane, and configured according to an embodiment of the invention.

FIG. 10 depicts an electronic system that is configured to be tested according to an embodiment of the invention. The system features a backplane 836 on which a parallel bus 816 is disposed. The backplane allows multiple cards such as cards 802 and 840 to be connected to the parallel bus 816 through respective bus connectors. The first card 840 contains the logic agent 120 whereas the second card 802 contains the logic agent 130. The logic agents communicate with each other, either unidirectionally or bidirectionally, through the multiple lines of the parallel bus 816. One or more sample lines 808 are disposed in the backplane adjacent to their corresponding signal lines of the parallel bus 816. An interface to a logic analyzer or other high speed electronic test equipment (not shown) may be placed on the backplane 836 to make dc contact with the two ends of each of the sample lines 808. Alternatively, two separate sample lines (such as shown in FIG. 1B), may be created for each signal line of the parallel bus 816, where the respective sample lines are placed on their corresponding cards 802 and 840. The crosstalk signals may be picked up via dedicated connectors on the respective cards, or they may be picked up through probe pads if the connector option is not available due to cost or space restrictions. It will be recognized by one of ordinary skill in the art that when there are a large number of signal lines to be tested using the various embodiments of the invention, appropriate escape patterns should be provided to access the bundle of sample lines 808.

To summarize, various embodiments of the invention have been described as techniques for testing high speed digital links such as chip-to-chip interconnections, by displaying as logic waveforms the digital signals being driven by their respective logic agents, based upon sensed crosstalk signals. In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather that a restrictive sense.

What is claimed is:

1. A method comprising:
   sensing a first crosstalk signal induced by a first digital signal, the first digital signal being driven by a first logic agent into a signal line to communicate with a second logic agent, the second agent coupled to receive the first digital signal from the signal line;
   at least one of displaying and recording a first logic waveform representing the first digital signal based upon the first crosstalk signal; and
   sensing a second crosstalk signal induced by a second digital signal, the second digital signal being driven by the second logic agent into the signal line to communicate with the first agent.

2. The method of claim 1 wherein the first and second logic agents are communicating simultaneously with each other by respectively and simultaneously driving the first and second digital signals in opposite directions on the signal line.

3. The method of claim 1 further comprising:
   at least one of displaying and recording a second logic waveform representing the second digital signal based upon the second crosstalk signal.

4. An electronic system comprising:
   a first signal line;
   first and second logic agents coupled to communicate with each other through the signal line, the first logic agent capable of driving a first digital signal into the signal line to communicate with the second agent;
   a first sample line electrically isolated from and disposed with respect to the signal line so that a first crosstalk signal is induced in the sample line in response to the first digital signal, wherein the second logic agent is capable of driving a second digital signal into the signal line to communicate with the first agent, the sample line being disposed with respect to the signal line so that a second crosstalk signal is induced in the sample line in response to the second digital signal; and
   test equipment coupled to sense the first crosstalk signal from the first sample line, and at least one of display and record a first logic waveform representing the first digital signal based upon the first crosstalk signal.

5. The system of claim 4 wherein the signal line has two opposite ends, the agents are coupled to drive the first and second digital signals into the two ends, respectively.

6. The system of claim 4 and wherein the sample line has a near portion and a far portion, and wherein the signal line has a first point at which the first logic agent drives the first digital signal into the signal line, the near portion being closer than the far portion as measured along the signal line to the first point, and wherein the test equipment is coupled to sense the first crosstalk signal at the near portion of the sample line.

7. The system of claim 4 further comprising:
   a second signal line coupled between the first and second agents, the first and second signal lines to be used for differential signaling between the first and second agents.

8. The system of claim 4 wherein the test equipment is further coupled to sense the second crosstalk signal from the sample line, and at least one of display and record a second logic waveform representing the second digital signal based upon the second crosstalk signal.

9. The system of claim 4 wherein the first and second logic agents communicate simultaneously with each other by respectively and simultaneously driving the first and second digital signals in opposite directions on the signal line.

10. The system of claim 8 wherein the signal line has a second point at which the second logic agent drives the second digital signal into the signal line, a far portion of the sample line being closer than a near portion to the second point, and wherein the test equipment is coupled to sense the second crosstalk signal at the far portion of the sample line.

11. The system of claim 4 further comprising:
    a second sample line separate from the first sample line and being disposed with respect to the signal line so that a second crosstalk signal is induced in the second sample line in response to the second digital signal.

12. The system of claim 11 wherein the test equipment is coupled to sense the second crosstalk signal from the second sample line, and at least one of display and record a second logic waveform representing the second digital signal based upon the second crosstalk signal.

13. The system of claim 12 wherein the second sample line has a near portion and a far portion, and wherein the signal line has a second point at which the second logic agent drives the second digital signal into the signal line, the near portion of the second sample line being closer than its far portion as measured along the signal line to the second point, and wherein the test equipment is coupled to sense the second crosstalk signal at the near portion of the second sample line.

14. The system of claim 4 further comprising:
    a plurality of additional signal lines which together with the first signal line form part of a simultaneous bidirectional parallel bus coupled between the first and second logic agents.

15. The system of claim 14 wherein the first agent is a processor, the second agent is a bridge, and the additional signal lines are formed on a backplane.

16. An electronic system comprising:
    a first signal line;
    first and second logic agents coupled to communicate with each other through the signal line, the first logic agent capable of driving a first digital signal into the signal line to communicate with the second agent, the second agent coupled to receive the first digital signal from the signal line;

means for sensing a first crosstalk signal, the crosstalk signal having been generated in response to the first digital signal;

means for sensing a second crosstalk signal, the second crosstalk signal having been generated in response to a second digital signal driven by the second logic agent into the signal line to communicate with the first agent; and at least one of means for displaying and recording a first logic waveform, the first logic waveform representing the first digital signal and derived from the first crosstalk signal.

17. The system of claim 16 further comprising:

at least one of means for displaying and recording a second logic waveform, the second logic waveform representing the second digital signal and derived from the second crosstalk signal.

18. The system of claim 16 wherein the first and second logic agents communicate simultaneously with each other by respectively and simultaneously driving the first and second digital signals in opposite directions on the signal line.

19. An electronic system comprising:

a first signal line;

first and second logic agents coupled to communicate with each other through the signal line, the first logic agent capable of driving a first digital signal into the signal line to communicate with the second agent;

a first sample line electrically isolated from and disposed with respect to the signal line so that a first crosstalk signal is induced in the sample line in response to the first digital signal;

a second sample line separate from the first sample line and being disposed with respect to the signal line so that a second crosstalk signal is induced in the second sample line in response to the second digital signal; and test equipment coupled to sense the first crosstalk signal from the first sample line, and at least one of display and record a first logic waveform representing the first digital signal based upon the first crosstalk signal.

20. The system of claim 19 wherein the test equipment is coupled to sense the second crosstalk signal from the second sample line, and at least one of display and record a second logic waveform representing the second digital signal based upon the second crosstalk signal.

21. The system of claim 20 wherein the second sample line has a near portion and a far portion, and wherein the signal line has a second point at which the second logic agent drives the second digital signal into the signal line, the near portion of the second sample line being closer than its far portion as measured along the signal line to the second point, and wherein the test equipment is coupled to sense the second crosstalk signal at the near portion of the second sample line.

22. The system of claim 19 further comprising:

a second signal line coupled between the first and second agents, the first and second signal lines to be used for differential signaling between the first and second agents.

23. The system of claim 19 further comprising:

a plurality of additional signal lines which together with the first signal line form part of a simultaneous bidirectional parallel bus coupled between the first and second logic agents.

24. An electronic system comprising:

a first signal line;

first and second logic agents coupled to communicate with each other through the signal line, the first logic agent capable of driving a first digital signal into the signal line to communicate with the second agent;

a second signal line coupled between the first and second agents, the first and second signal lines to be used for differential signaling between the first and second agents;

a first sample line electrically isolated from and disposed with respect to the signal line so that a first crosstalk signal is induced in the sample line in response to the first digital signal; and test equipment coupled to sense the first crosstalk signal from the first sample line, and at least one of display and record a first logic waveform representing the first digital signal based upon the first crosstalk signal.

25. The system of claim 24 and wherein the sample line has a near portion and a far portion, and wherein the first signal line has a first point at which the first logic agent drives the first digital signal into the signal line, the near portion being closer than the far portion as measured along the signal line to the first point, and wherein the test equipment is coupled to sense the first crosstalk signal at the near portion of the sample line.

26. The system of claim 24 wherein the second logic agent is capable of driving a second digital signal into the first signal line to communicate with the first agent, the sample line being disposed with respect to the first signal line so that a second crosstalk signal is induced in the sample line in response to the second digital signal.

27. The system of claim 26 wherein the first and second logic agents communicate simultaneously with each other by respectively and simultaneously driving the first and second digital signals in opposite directions on the first signal line.

28. The system of claim 26 wherein the test equipment is further coupled to sense the second crosstalk signal from the sample line, and at least one of display and record a second logic waveform representing the second digital signal based upon the second crosstalk signal.

29. The system of claim 28 wherein the first signal line has a second point at which the second logic agent drives the second digital signal into the first signal line, a far portion of the sample line being closer than a near portion to the second point, and wherein the test equipment is coupled to sense the second crosstalk signal at the far portion of the sample line.

30. The system of claim 24 further comprising:

a second sample line separate from the first sample line and being disposed with respect to the first signal line so that a second crosstalk signal is induced in the second sample line in response to the second digital signal.

31. An electronic system comprising:

a first signal line;

first and second logic agents coupled to communicate with each other through the signal line, the first logic agent capable of driving a first digital signal into the signal line to communicate with the second agent;

a plurality of additional signal lines which together with the first signal line form part of a simultaneous bidirectional parallel bus coupled between the first and second logic agents;

a first sample line electrically isolated from and disposed with respect to the signal line so that a first crosstalk signal is induced in the sample line in response to the first digital signal; and test equipment coupled to sense the first crosstalk signal from the sample line, and at least one of display and record a first logic waveform representing the first digital signal based upon the first crosstalk signal.

32. The system of claim 31 further comprising:

a second sample line separate from the first sample line and being disposed with respect to the first signal line so that a second crosstalk signal is induced in the second sample line in response to the second digital signal.

33. The system of claim 32 wherein the test equipment is coupled to sense the second crosstalk signal from the second sample line, and at least one of display and record a second logic waveform representing the second digital signal based upon the second crosstalk signal.

34. The system of claim 33 wherein the second sample line has a near portion and a far portion, and wherein the first signal line has a second point at which the second logic agent drives the second digital signal into the first signal line, the near portion of the second sample line being closer than its far portion as measured along the first signal line to the second point, and wherein the test equipment is coupled to sense the second crosstalk signal at the near portion of the second sample line.

35. The system of claim 31 and wherein the sample line has a near portion and a far portion, and wherein the first signal line has a first point at which the first logic agent drives the first digital signal into the first signal line, the near portion being closer than the far portion as measured along the first signal line to the first point, and wherein the test equipment is coupled to sense the first crosstalk signal at the near portion of the sample line.

36. The system of claim 31 wherein the second logic agent is capable of driving a second digital signal into the first signal line to communicate with the first agent, the sample line being disposed with respect to the first signal line so that a second crosstalk signal is induced in the sample line in response to the second digital signal.

37. The system of claim 36 wherein the test equipment is further coupled to sense the second crosstalk signal from the sample line, and at least one of display and record a second logic waveform representing the second digital signal based upon the second crosstalk signal.

38. The system of claim 36 wherein the first and second logic agents communicate simultaneously with each other by respectively and simultaneously driving the first and second digital signals in opposite directions on the signal line.

39. The system of claim 37 wherein the first signal line has a second point at which the second logic agent drives the second digital signal into the first signal line, a far portion of the sample line being closer than a near portion to the second point, and wherein the test equipment is coupled to sense the second crosstalk signal at the far portion of the sample line.

* * * * *